(12) United States Patent
Xu et al.

(10) Patent No.: US 9,946,379 B2
(45) Date of Patent: Apr. 17, 2018

(54) DISPLAY PANEL, DRIVING METHOD THEREOF, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Zouming Xu, Beijing (CN); Ming Hu, Beijing (CN); Hongqiang Luo, Beijing (CN); Weigang Gong, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 14/651,387

(22) PCT Filed: Jan. 16, 2015

(86) PCT No.: PCT/CN2015/070875
§ 371 (c)(1),
(2) Date: Jun. 11, 2015

(87) PCT Pub. No.: WO2016/033928
PCT Pub. Date: Mar. 10, 2016

(65) Prior Publication Data
US 2016/0283001 A1   Sep. 29, 2016

(30) Foreign Application Priority Data
Sep. 3, 2014   (CN) .......................... 2014 1 0446144

(51) Int. Cl.
*G06F 3/041* (2006.01)
*G06F 3/044* (2006.01)
(Continued)

(52) U.S. Cl.
CPC ........ *G06F 3/0412* (2013.01); *G02F 1/13338* (2013.01); *G02F 1/133512* (2013.01);
(Continued)

(58) Field of Classification Search
CPC ...... G06F 3/0412; G06F 3/0416; G06F 3/044; G06F 3/047; G06F 2203/04111;
(Continued)

(56) References Cited

U.S. PATENT DOCUMENTS

| 8,487,903 B2 | 7/2013 | Anno et al. |
| 2008/0129706 A1 | 6/2008 | Kim et al. |

(Continued)

FOREIGN PATENT DOCUMENTS

| CN | 102466907 A | 5/2012 |
| CN | 102968231 A | 3/2013 |

(Continued)

OTHER PUBLICATIONS

International Search Report dated Mar. 30, 2015 issued in International Application No. PCT/CN2015/070875.
(Continued)

*Primary Examiner* — Nathan Danielsen
(74) *Attorney, Agent, or Firm* — Nath, Goldberg & Meyer; Joshua B. Goldberg; Stanley N. Protigal

(57) ABSTRACT

The present invention relates to the field of display technology, and particularly relates to a display panel, a driving method thereof, and a display device. The display panel comprises a light blocking layer formed of a material with light blocking and electroconductive properties, the light blocking layer including an isolation part electrically isolated from other part of the light blocking layer, the isolation part being further configured to emit a touch driving signal and/or receive a touch sensing signal to achieve a touch control function of the display panel. The display panel has
(Continued)

both display function and touch control function, and has a simpler structure and a higher transmittance; the manufacturing process is simpler, and meanwhile, the production cost is reduced and the product yield is improved.

16 Claims, 3 Drawing Sheets

(51) Int. Cl.
*G06F 3/047* (2006.01)
*H01L 27/32* (2006.01)
*H01L 51/52* (2006.01)
*G02F 1/1333* (2006.01)
*G02F 1/1335* (2006.01)

(52) U.S. Cl.
CPC .............. *G06F 3/044* (2013.01); *G06F 3/047* (2013.01); *G06F 3/0416* (2013.01); *H01L 27/323* (2013.01); *H01L 27/3272* (2013.01); *H01L 27/3276* (2013.01); *H01L 51/5284* (2013.01); *G02F 1/133514* (2013.01); *G02F 2202/16* (2013.01); *G06F 2203/04103* (2013.01)

(58) Field of Classification Search
CPC .......... G06F 2203/04112; G09G 3/36–3/3696; G02F 1/13338; G02F 1/133512; G02F 1/133514; H01L 27/323; H01L 27/3272; H01L 27/3276
See application file for complete search history.

(56) References Cited

U.S. PATENT DOCUMENTS

| 2010/0136868 | A1* | 6/2010 | Chien .................. G06F 3/0412 445/24 |
| 2012/0105337 | A1* | 5/2012 | Jun ....................... G06F 3/0412 345/173 |
| 2013/0044074 | A1* | 2/2013 | Park ........................ G06F 3/044 345/174 |
| 2014/0118299 | A1* | 5/2014 | Wang .................... G06F 3/0416 345/174 |
| 2014/0152613 | A1* | 6/2014 | Ishizaki ............... G06F 3/0412 345/174 |

FOREIGN PATENT DOCUMENTS

| CN | 103034366 A | 4/2013 |
| CN | 203133782 U | 8/2013 |
| CN | 103294273 A | 9/2013 |
| CN | 103294312 A | 9/2013 |
| CN | 103376591 A | 10/2013 |
| CN | 103823601 A | 5/2014 |
| CN | 203706176 U | 7/2014 |
| CN | 104238814 A | 12/2014 |
| CN | 104238815 A | 12/2014 |

OTHER PUBLICATIONS

Office Action dated Aug. 30, 2016 issued in corresponding Chinese Application No. 201410446144.X.
Office Action dated Mar. 30, 2017 issued in corresponding Chinese Application No. 201410446144.X.

* cited by examiner

DISPLAY PANEL, DRIVING METHOD THEREOF, AND DISPLAY DEVICE

This is a National Phase Application filed under 35 U.S.C. 371 as a national stage of PCT/CN2015/070875 filed on Jan. 16, 2015, an application claiming the benefit to Chinese application No. 201410446144.X filed on Sep. 3, 2014; the content of each of which is hereby incorporated by reference in its entirety.

FIELD OF THE INVENTION

The present invention relates to the field of display technology, and particularly relates to a display panel, a driving method thereof, and a display device.

BACKGROUND OF THE INVENTION

Touch panels are currently newest information input devices, and can simply, conveniently and naturally implement human-machine interaction and provide a brand new multimedia human-machine interaction method, making people feel visual and tactile enjoyment. With rapid changes of display technology and increasingly fierce competition, it has become a trend to implement a touch display structure with a low cost and high performance.

Display devices with a touch control function can be divided into a resistance type, a capacitance type, a surface acoustic wave type, an infrared type and the like according to the sensing principle, and can be divided into an out-cell structure, an on-cell structure and an in-cell structure according to the structural relation between a touch panel and a display screen.

At present, most touch panels adopt an out-cell structure, and in an out-cell technology, generally a touch panel and a display (such as liquid crystal display, abbreviated as LCD) screen are manufactured separately and then fit together. Such a structure has shortcomings of a complex process, a high cost, a low transmittance, a thick module and the like.

As to an in-cell structure, since a touch structure is embedded in a display screen to achieve touch and display integration, lightness and thinness of a display device are readily achievable and the production cost can also be reduced, and thus touch display devices with the in-cell structure are very popular for manufactures in the display field. However, in the existing in-cell technology, generally both a sensing electrode and an emitting electrode for achieving the touch control function are arranged in an array substrate, so a complex semiconductor manufacturing process must be used to form the array substrate, which results in a low production yield of the array substrate; furthermore, embedding a touch sensor (such as sensing electrode and emitting electrode) in a pixel structure of the display screen can reduce an effective area available for display, leading to degradation of display effect.

Thus, it has become one of important issues for designers currently to design a touch display panel with a high transmittance, a simple structure, a simple manufacturing process and a low cost.

SUMMARY OF THE INVENTION

To solve the above technical problem, the present invention provides a display panel, a driving method thereof, and a display device in view of the shortcomings in the prior art, the display panel having both display and touch control functions, and having a simpler structure and a higher transmittance; the manufacturing process of the display panel is simpler, and meanwhile, the production cost is reduced and the product yield is improved.

A technical solution adopted for solving the above problem is a display panel including a light blocking layer formed of a material with light blocking and electroconductive properties, the light blocking layer including an isolation part electrically isolated from other part of the light blocking layer, the isolation part being further configured to emit a touch driving signal and/or receive a touch sensing signal to achieve the touch control function of the display panel.

Preferably, the display panel further includes scanning signal lines, wherein the isolation part and the scanning signal lines intersect each other and are arranged in different layers; the isolation part is further configured to emit the touch driving signal or receive the touch sensing signal; and part of the scanning signal lines are further configured to accordingly receive the touch sensing signal or emit the touch driving signal.

Preferably, the light blocking layer is formed as a grid with intersecting rows and columns; gaps are provided between a part of the light blocking layer located in the same row and a part located in an adjacent row to form the isolation part; or gaps are provided between a part of the light blocking layer located in the same column and a part located in an adjacent column to form the isolation part.

Preferably, a proportion of number of rows or number of columns of the isolation part to number of rows or number of columns of other part of the light blocking layer is ranges from 1:3 to-1:6.

Preferably, a width of the gap ranges from of 1 μm-to 3 μm.

Preferably, the material with light blocking and electroconductive properties includes copper, molybdenum, copper oxide, molybdenum oxide or an alloy thereof.

Preferably, the display panel includes a color film substrate and an array substrate that are aligned with each other to form a cell, and a liquid crystal layer disposed between the color film substrate and the array substrate, the light blocking layer being arranged in the color film substrate, and the scanning signal lines being arranged in the array substrate; or the display panel includes an array substrate and organic electroluminescent diodes located above the array substrate, the light blocking layer being located above the organic electroluminescent diodes, and the scanning signal lines being located below the organic electroluminescent diodes.

The present invention also provides a display device including the display panel provided by the present invention.

The present invention also provides a driving method of the display panel, for driving the display panel to operate in a display phase and a touch phase in a time division manner, the method including the following steps: in the touch phase, emitting the touch driving signal or receiving the touch sensing signal by the isolation part, and accordingly receiving the touch sensing signal or emitting the touch driving signal by the part of the scanning signal lines; and in the display phase, performing scanning signal transmission by the scanning signal lines.

Preferably, in the touch phase, a time period of emitting the touch driving signal by the isolation part corresponds to a time period of receiving the touch sensing signal by the part of the scanning signal lines; or a time period of receiving the touch sensing signal by the isolation part corresponds to a time period of emitting the touch driving signal by the part of the scanning signal lines.

Preferably, in the touch phase, applying the touch driving signal to the isolation part or the part of the scanning signal lines, and receiving the touch sensing signal by the part of the scanning signal lines or the isolation part correspondingly.

The present invention has the following beneficial effects: in the display panel, since part of the light blocking layer in the display panel also serves as an emitting electrode and/or a sensing electrode in a touch structure, a touch and display integrated structure is formed, resulting in a simpler structure, a higher transmittance and a simpler manufacturing process, reducing the production cost and improving the product yield. In addition, the display device including the display panel has better display quality.

REFERENCE NUMERALS

1—color film substrate; 10—first underlayer; 11—light blocking layer; 111—gap; 12—color film layer; 13—first touch electrode (sensing electrode Rx or emitting electrode Tx);
2—array substrate; 20—second underlayer; 21—thin film transistor; 22—gate line; 23—data line; 24—common electrode; 25—pixel electrode; 26—second touch electrode (emitting electrode Tx or sensing electrode Rx); 27—insulating layer;
3—liquid crystal layer.

DETAILED DESCRIPTION OF THE EMBODIMENTS

To make the person skilled in the art better understand the technical solution of the present invention, a display panel, a driving method thereof, and a display device of the present invention are further described below in detail in conjunction with the accompanying drawings and the specific implementations.

A display panel, including a light blocking layer formed of a material with light blocking and electroconductive properties, the light blocking layer including an isolation part electrically isolated from other part of the light blocking layer, the isolation part being further configured to emit a touch driving signal and/or receive a touch sensing signal to achieve a touch control function of the display panel. The display panel is not only applicable to a liquid crystal display device, but also applicable to an OLED display device. In the display panel, since part of the light blocking layer in the display panel also serves as an emitting electrode and/or a sensing electrode in a touch structure, a touch and display integrated structure is formed, resulting in a simpler structure, a higher transmittance and a simpler manufacturing process, reducing the production cost and improving the product yield.

First Embodiment

The embodiment provides a display panel applicable to a liquid crystal display device.

Figure 1:
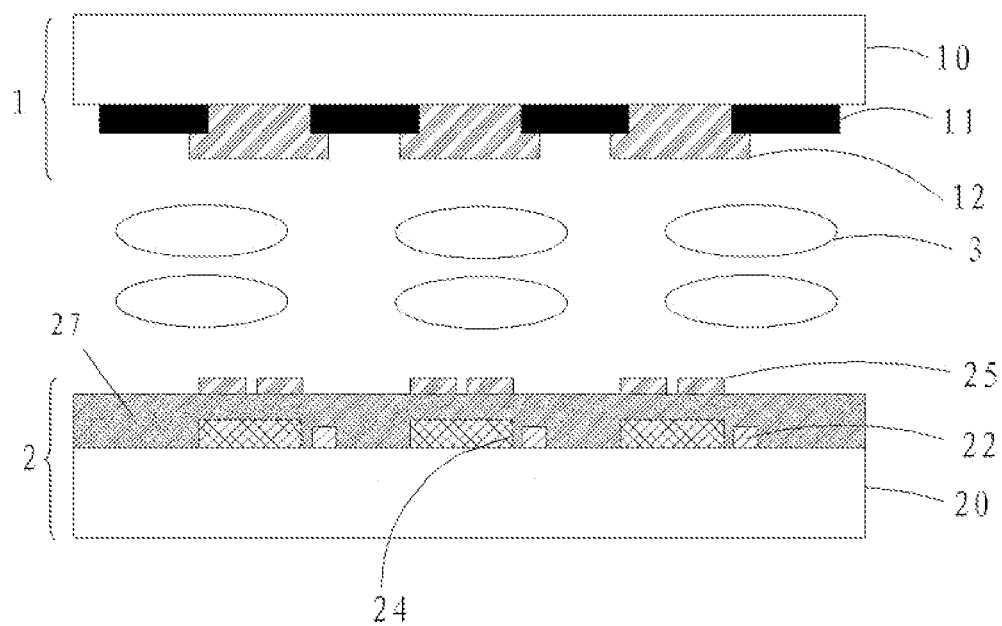
FIG. 1 is a sectional view of a display panel according to first embodiment of the present invention.

As shown in FIG. 1, the display panel includes a color film substrate 1 and an array substrate 2 that are aligned with each other to form a cell, and a liquid crystal layer 3 disposed between the color film substrate 1 and the array substrate 2. In general, the array substrate 2 is provided therein with thin film transistors (TFTs) 21 (the thin film transistors 21 are not shown in FIG. 1 and can be seen in FIG. 5) for controlling light emission to implement image display; and the color film substrate 1 is provided therein with a color film layer 12 for achieving image colorization.

In order to prevent light leak between pixel structures of the display panel to influence display effect, the color film substrate 1 is generally also provided therein with a light blocking layer 11. In general, the light blocking layer 11 is arranged in the color film substrate 1, and the scanning signal lines (i.e. gate lines) are arranged in the array substrate 2, so that the light blocking layer 11 and the scanning signal lines are arranged in different layers. In the display panel of the embodiment, part of the gate lines 22 in the array substrate 2 also serve as a sensing electrode Rx or an emitting electrode Tx in the touch structure for achieving the touch control function, and part of the light blocking layer 11 in the color film substrate 1 also serves as the emitting electrode Tx or the sensing electrode Rx in the touch structure.

Figure 4:
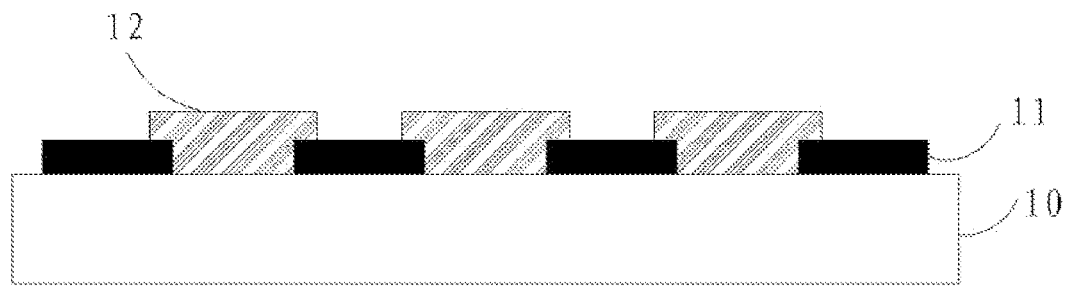
FIG. 4 is a sectional view of the color film substrate shown in FIG. 2.

Specifically, as shown in FIG. 4, the color film substrate 1 includes a first underlayer 10, the light blocking layer 11 and the color film layer 12 arranged on the first underlayer 10, wherein, the light blocking layer 11 is formed of a material with light blocking and electroconductive properties, the material including copper, molybdenum, copper oxide, molybdenum oxide or an alloy thereof. In the embodiment, the color film layer 12 can achieve a colorization function; on the one hand, the light blocking layer 11 acts as a black matrix (BM) in the prior art and has the function of preventing light leak, and on the other hand, through replacing an insulating black matrix in the prior art with the light blocking layer 11 with electroconductive property, part of the light blocking layer 11 also serves as the emitting electrode Tx or the sensing electrode Rx (hereinafter referred to as first touch electrode) in the touch structure, that is, part of the light blocking layer 11 has the light blocking function and also acts as the first touch electrode 13 (such as emitting electrode Tx or sensing electrode Rx) in the touch structure. As the color film layer 12 and other functional film layers (such as planarization layer and/or transparent protective layer, etc.) in the color film substrate 1 all have insulating property, configuring the light blocking layer 11 as a layer structure with electroconductive property has no influence on performance of the color film substrate 1.

Figure 2:
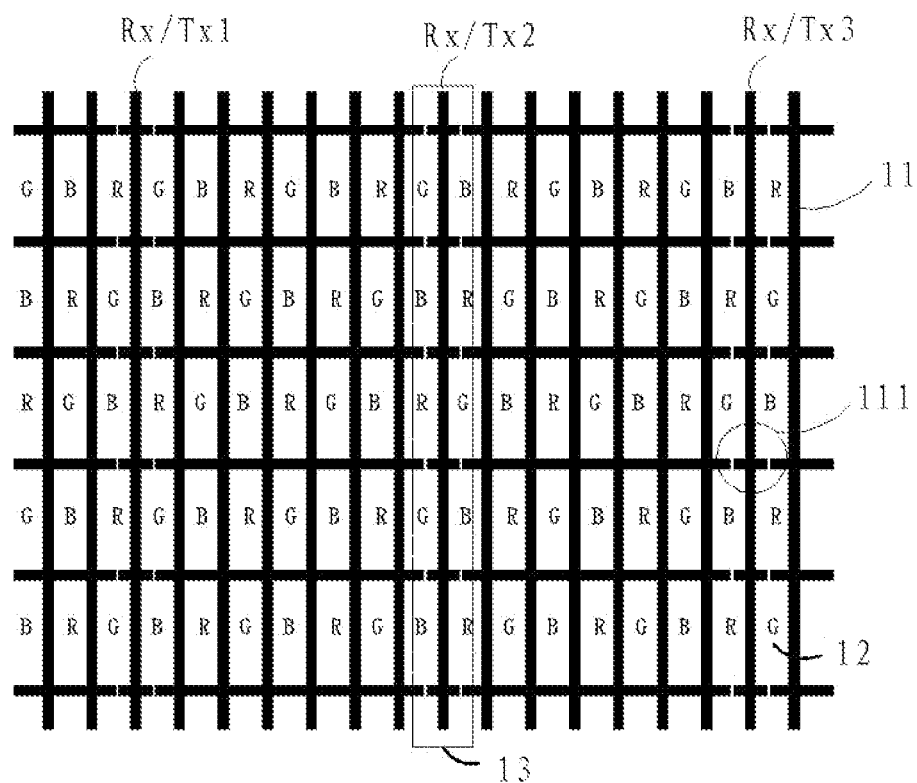
FIG. 2 is a top view of a color film substrate in the display panel shown in FIG. 1.
Figure 3:
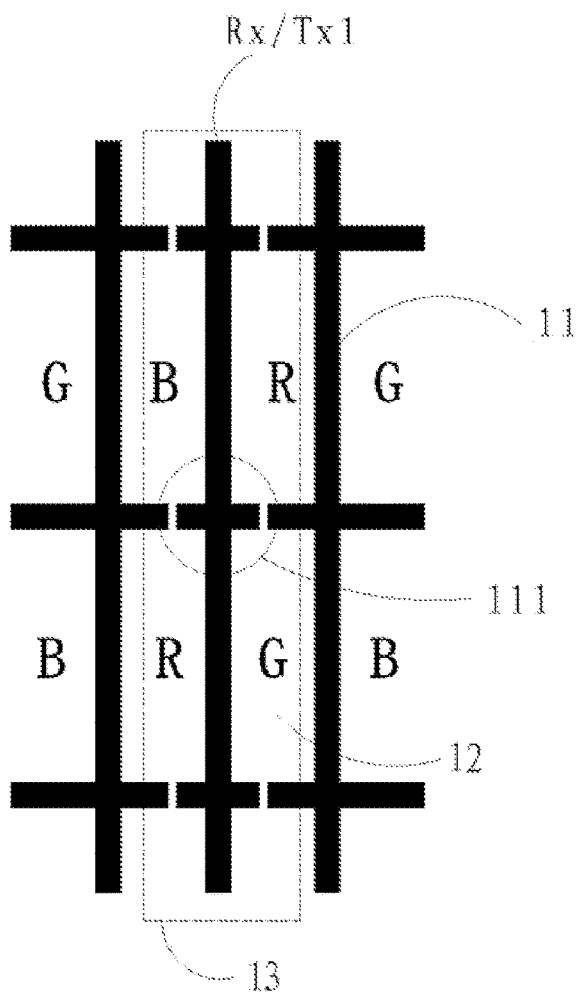
FIG. 3 is a partial enlarged view of FIG. 2.

In the embodiment, part of the light blocking layer 11 is electrically isolated from other part of the light blocking layer 11 to form the isolation part intersecting the scanning signal lines, the isolation part being further configured to emit a touch driving signal and/or receive a touch sensing signal (i.e. acting as the emitting electrode Tx or the sensing electrode Rx), and part of the scanning signal lines being further configured to receive the touch sensing signal or emit the touch driving signal (i.e. acting as the sensing electrode Rx or the emitting electrode Tx). As shown in FIGS. 2 and 3, the light blocking layer 11 is formed as a grid with intersecting rows and columns, and gaps 111 are provided between a part of the light blocking layer 11 located in the same row or in the same column and another part located in an adjacent row or in an adjacent column to form the isolation part. For example, the gaps 111 are provided between a part of the light blocking layer 11 located in the same row (row-wise light blocking layer part) and a part located in an adjacent row to form the isolation part; or the gaps 111 are provided between a part of the light blocking layer 11 located in the same column (column-wise light blocking layer part) and a part located in an adjacent column to form the isolation part (just as shown in FIGS. 2 and 3). Here, taking a vertically disposed display panel as an example, "row" is defined as a horizontal direction parallel to the ground, and "column" is defined as a vertical direction perpendicular to the ground; and gaps between row-wise light blocking layers are formed between row light blocking layers being adjacent in the vertical direction, and gaps between column-wise light blocking layers are formed between column light blocking layers being adjacent in the horizontal direction. It can be understood that the isolation part for achieving the two functions of light blocking and touch control is not necessarily a part formed of a whole row or a whole column in the light blocking layer as shown in the drawings, but may take any of other various appropriate forms, e.g. the isolation part including two adjacent rows electrically isolated from other part. Furthermore, to electrically isolate the isolation part from other part, the gap described above is not necessarily adopted, but any of other various appropriate forms may be taken. For example, the gap may be filled with an insulating material to have the same shape as the gap. This is not defined in the present invention.

Here, it should be understood that different colors (RBG) in the color film layer 12 may take the forms of strip arrangement, mosaic arrangement (just as shown in FIGS. 2 and 3) and triangular arrangement, and this is not defined herein.

It can be seen clearly from the partial enlarged view of FIG. 3 that gaps 111 are formed between the column-wise light blocking layer part located in the middle and the column-wise light blocking layer parts on the left side and on the right side thereof respectively, so that the column-wise light blocking layer part located in the middle is isolated from other column-wise light blocking layer parts to form a column-wise isolation part serving as the first touch electrode 13. To simplify pattern design of a mask plate used in a patterning process for forming the light blocking layer, preferably the gaps between the column-wise isolation part and a column-wise light blocking part on either side thereof and adjacent thereto are located on the same vertical straight line. In order to ensure light blocking effect of the light blocking layer 11, preferably the width of the gap 111 is within the range of 1-3 μm.

In the embodiment, the pattern of the entire light blocking layer 11 is converted through the gaps 111 to a pattern comprising an isolation part with an independent wiring pattern to serve as a separately controllable structure, so that the light blocking layer 11 not only can prevent light leak, but also can serve as an electrode in the touch structure (each isolation part forming the first touch electrode is independently connected to a pin of a drive IC of the display panel); moreover, the gaps 111 can be formed simultaneously with the light blocking layer 11 through the patterning process for forming the pattern of the light blocking layer 11 (including multiple processes such as exposure, development and even etching, etc.), needing no additional process procedure.

To ensure touch accuracy, preferably the proportion of the number of rows or the number of columns of the isolation part to the number of rows or the number of columns of other part of the light blocking layer ranges from 1:3 to 1:6.

Figure 5:
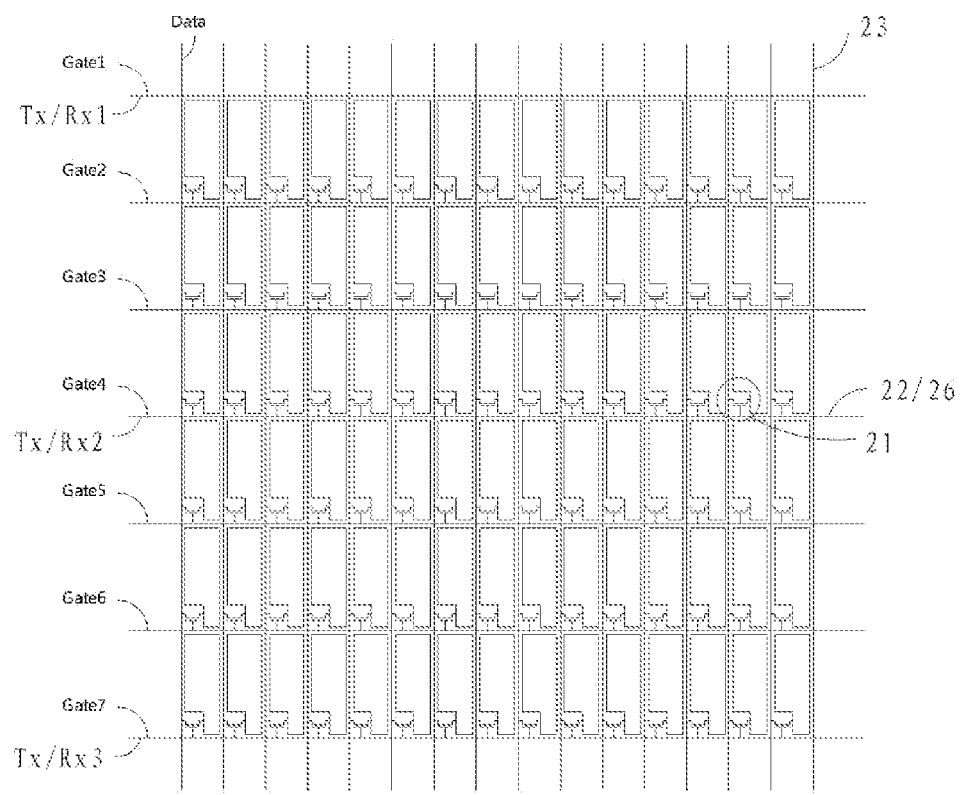
FIG. 5 is a top view of an array substrate in the display panel shown in FIG. 1.
Figure 6:
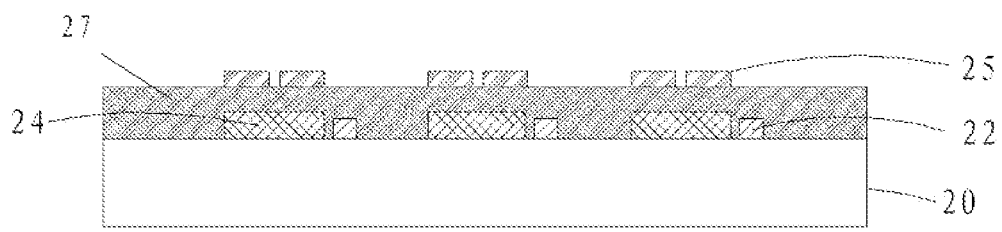
FIG. 6 is a sectional view of the array substrate shown in FIG. 5.

As shown in FIGS. 5 and 6, the array substrate 2 includes a second underlayer 20 and scanning signal lines (Gate, namely gate lines 22) and displaying signal lines (Data, namely data lines 23) intersecting vertically and horizontally arranged on the second underlayer 20; and thin film transistors 21 (see FIG. 5), oppositely arranged pixel electrodes 25 and common electrodes 24 and an insulating layer 27 therebetween are arranged in a pixel region defined by the gate lines 22 and the data lines 23, wherein, the TFTs serve as a control switch for switching on and off the pixels. In the embodiment, part of the gate lines 22 also serve as another electrode in the touch structure, i.e. a second touch electrode 26 cooperating with the first touch electrode 13 in the touch structure in the light blocking layer 11, such as a sensing electrode Rx or emitting electrode Tx. As the second touch electrode is merely implemented by time division multiplexing of part of the gate lines 22, and results in no change of and has no influence on the structure of the array substrate 2, the second touch electrode 26 is formed simultaneously with formation of the array substrate 2, needing no additional process procedure.

Here, it should be understood that during implementation of the touch control function, the emitting electrode and the sensing electrode are arranged correspondingly, and after the number of touch channels is determined, equal division designing can be carried out on the isolation part according to the determined number of channels, and accordingly, a determined number of scanning signal lines are chosen at equal intervals; or unequal division designing is carried out on the isolation part according to touch accuracy or customer requirement, and a determined number of scanning signal lines are chosen at unequal intervals.

Accordingly, the embodiment also provides a driving method of the display panel, for driving the display panel to operate in a display phase and a touch phase in a time division manner; in the touch phase, the touch driving signal is emitted or the touch sensing signal is received by the isolation part, and accordingly the touch sensing signal is received or the touch driving signal is emitted by part of the scanning signal lines; and in the display phase, scanning signal transmission is carried out by the scanning signal lines. That is, the isolation part emits the touch driving signal or receives the touch sensing signal to serve as the first touch electrode 13 in the touch phase; and part of the scanning signal lines are time division multiplexed to carry out scanning signal transmission in the display phase and receive the touch sensing signal or emit the touch driving signal to serve as the second touch electrode 26 in the display phase. That is to say, part of the gate lines 22 receive signals in two phases: for receiving a scanning signal in the display phase, to enable the display panel to display an image; and for receiving a touch signal in the touch phase, to enable the display panel to position the touch signal to achieve the touch control function. Here, part of the gate lines are time division multiplexed to serve as scanning signal lines for display and touch driving signal emitting lines or touch signal sensing lines for touch, and can be controlled through a software interface in a drive module, which is not described herein in detail.

Specifically, in the embodiment, the emitting electrode and the sensing electrode in the touch structure are formed by part of the gate lines 22 in the array substrate 2 and part of the light blocking layer 11 in the color film substrate 1 respectively, wherein the display phase, no signal is applied to the isolation part, and a scanning signal is applied to the gate lines 22, and a gray scale signal is applied to the data lines 23, for image display; and in the touch phase, a touch driving signal is applied to the emitting electrode (such as part of the gate lines 22 in the array substrate 2), and driven by the touch driving signal, the touch structure senses a touch signal, which is output to the sensing electrode (such as the isolation part in the color film substrate 1), to achieve touch control.

Preferably, in the touch phase, the time period of emitting the touch driving signal by the isolation part corresponds to the time period of receiving the touch sensing signal by part of the scanning signal lines; or the time period of receiving the touch sensing signal by the isolation part corresponds to the time period of emitting the touch driving signal by part of the scanning signal lines. That is, in the touch phase, the touch driving signal is applied to the isolation part or part of the scanning signal lines, and the isolation part or part of the scanning signal lines are equivalent to touch driving signal lines in this phase; and correspondingly, part of the scanning signal lines or the isolation part receives the touch sensing signal, and part of the scanning signal lines or the isolation part is equivalent to touch sensing signal lines in this phase. Specifically, in the touch phase, through applying a touch scanning signal to the isolation parts successively, a horizontal coordinate (i.e. coordinate in X direction) or vertical coordinate (i.e. coordinate in Y direction) of a touch point can be positioned, and through detecting column by column a voltage signal change on part of the scanning signal lines, a vertical coordinate (i.e. coordinate in Y direction) or horizontal coordinate (i.e. coordinate in X direction) of the touch point can be positioned; or through applying a touch scanning signal to the part of the scanning signal lines successively, a horizontal coordinate (i.e. coordinate in X direction) or vertical coordinate (i.e. coordinate in Y direction) of a touch point can be positioned, and through detecting column by column a voltage signal change on the isolation parts, a vertical coordinate (i.e. coordinate in Y direction) or horizontal coordinate (i.e. coordinate in X direction) of the touch point can be positioned, thereby determining the position of the touch point to achieve the touch control function.

The embodiment provides an in-cell capacitive display panel; by adopting the light blocking layer with light blocking and electroconductive properties in a color film substrate 1 in place of the existing insulating black matrix and dividing the light blocking layer so that part of the light blocking layer serves as an electrode in the touch structure, and by adopting part of the gate lines 22 in the array substrate 2 as another electrode in the touch structure, the touch electrode in the color film substrate 1 and the touch electrode in the array substrate 2 intersect each other, thus a touch structure capable of implementing touch positioning is formed in the structure of the color film substrate 1 and the array substrate 2 capable of implementing display to achieve touch and display integration; in the above touch display structure, the touch electrodes are also formed while the display panel is formed, and the touch structure can be obtained while needing no additional process, not only effectively increasing the transmittance of the touch display device, but also simplifying process steps, reducing the production cost and improving the production efficiency.

Second Embodiment

The embodiment provides a display panel applicable to an Organic Light-Emitting Diode (OLED) display device.

An OLED is a light emitting device using an organic solid-state semiconductor as a light emitting material, and there is a most mature technology for white organic light emitting diode (White OLED, namely WOLED), which has a good stability, a simple manufacturing process, and thus is widely applied in display devices. Like a crystal liquid display device, a WOLED display device usually needs a color film layer therein to achieve colorization.

With progress of display technology, there has emerged such a mode in the WOLED display device that a color film layer is arranged on an array substrate (Color Filter on Array, abbreviated as COA) to achieve a color display mode. In the embodiment, the display panel is formed in the COA mode, the display panel including an array substrate and organic electroluminescent diodes located above the array substrate, the light blocking layer being located above the organic electroluminescent diodes, and the scanning signal lines being located below the organic electroluminescent diodes.

Like in the first embodiment, the display panel is provided with a grid-like light blocking layer in the color film layer, and the light blocking layer is formed of a material with light blocking and electroconductive properties, with an gap formed between part of the light blocking layer and other parts of the light blocking layer so that the part of the light blocking layer forms an isolation part, which serves as an electrode in the touch structure; and part of the gate lines also serve as another electrode in the touch structure.

The driving method of the display panel in the embodiment is similar to that in the first embodiment, that is, in the display phase, no signal is applied to the isolation part, and a scanning signal is applied to the gate lines, and a gray scale signal is applied to the data lines, for image display; and in the touch phase, a touch driving signal is applied to the emitting electrode (such as part of the gate lines in the array substrate), and driven by the touch driving signal, the touch structure senses a touch signal, which is output to the touch sensing electrode (such as the isolation part in the color film substrate), to achieve touch control. In this embodiment, part of the gate lines are time division multiplexed to carry out scanning signal transmission during display and apply a touch driving signal or output a touch sensing signal during touch, and part of the light blocking layer cooperates with the part of the gate lines to receive the touch sensing signal or to apply the touch driving signal during touch.

For the display panel in the first embodiment and the second embodiment, the touch control function is also achieved while image display is achieved, to form a touch and display integrated structure, and the touch structure that is the same as the structure for display in time division multiplexing is adopted, without the need to add a new structure, thus having a high transmittance, and needing no additional process procedure, reducing the production cost and improving the production efficiency.

It needs to be noted that although the implementation that part of the light blocking layer also serve as the emitting electrode or the sensing electrode in the touch structure is described in the above embodiments, it is also possible, based on the same inventive concept, that the light blocking layer also serves as the emitting electrode and the sensing electrode in the touch structure, that is, the emitting electrode and the sensing electrode are arranged in the same layer, and as arranging the emitting electrode and the sensing electrode in the same layer is known technology in the art, the implementation is not described herein in detail.

Third Embodiment

The embodiment provides a display device including the display panel in the embodiment or the second embodiment.

The display device may be a liquid crystal panel, electronic paper, an OLED panel, a mobile phone, a tablet computer, a television, a display, a notebook computer, a digital photo frame, a navigator, or any other product or component with a display function.

The display device integrates display and touch together, and as the display panel adopted therein has a high transmittance, the display device has good display quality.

It should be understood that the above implementations are only exemplary implementations for illustrating the principle of the present invention, however, the present invention is not limited thereto. Various modifications and improvements can be made by the person of ordinary skill in the art without departing from the spirit and essence of the present invention, and these modifications and improvements should also be considered to be within the protection scope of the present invention.

The invention claimed is:

1. A display panel, comprising a light blocking layer formed of a material with light blocking and electroconductive properties, and scanning signal lines, wherein the light blocking layer comprises an isolation part electrically isolated from other part of the light blocking layer, the isolation part and the scanning signal lines intersect each other and are arranged in different layers, the isolation part is further configured to emit a touch driving signal or receive a touch sensing signal and part of the scanning signal lines are further configured to accordingly receive the touch sensing signal or emit the touch driving signal, so as to achieve a touch control function of the display panel, wherein the display panel comprises an array substrate and organic electroluminescent diodes located above the array substrate, the light blocking layer being located above the organic electroluminescent diodes, and the scanning signal lines being located below the organic electroluminescent diodes, and wherein the light blocking layer is formed as a grid with intersecting rows and columns; a part of the light blocking layer located in two adjacent columns is electrically isolated from an adjacent part of the light blocking layer to form the isolation part.

2. The display panel according to claim 1, wherein a gap is provided between the isolation part and adjacent part of the light blocking layer.

3. The display panel according to claim 2, wherein a proportion of number of rows or number of columns of the isolation part to number of rows or number of columns of other part of the light blocking layer ranges from 1:3 to 1:6.

4. The display panel according to claim 2, wherein the gap has a width ranging from 1 μm to 3 μm.

5. The display panel according to claim 1, wherein the material with light blocking and electroconductive properties comprises copper, molybdenum, copper oxide, molybdenum oxide or an alloy thereof.

6. A display device comprising the display panel of claim 1.

7. The display device according to claim 6, wherein a gap is provided between the isolation part and adjacent part of the light blocking layer.

8. The display device according to claim 7, wherein a proportion of number of rows or number of columns of the isolation part to number of rows or number of columns of other part of the light blocking layer ranges from 1:3 to 1:6.

9. The display device according to claim 7, wherein the gap has a width ranging from 1 μm to 3 μm.

10. The display device according to claim 6, wherein the material with light blocking and electroconductive properties comprises copper, molybdenum, copper oxide, molybdenum oxide or an alloy thereof.

11. A driving method of the display panel of claim 1, for driving the display panel to operate in a display phase and a touch phase in a time division manner, wherein the method comprises the following steps:

in the touch phase, emitting the touch driving signal or receiving the touch sensing signal by the isolation part, and accordingly receiving the touch sensing signal or emitting the touch driving signal by the part of the scanning signal lines; and in the display phase, performing scanning signal transmission by the scanning signal lines.

12. The driving method according to claim 11, wherein in the touch phase, a time period of emitting the touch driving signal by the isolation part corresponds to a time period of receiving the touch sensing signal by the part of the scanning signal lines; or a time period of receiving the touch sensing signal by the isolation part corresponds to a time period of emitting the touch driving signal by the part of the scanning signal lines.

13. The driving method according to claim 12, wherein in the touch phase, the touch driving signal is applied to the isolation part or the part of the scanning signal lines, and the touch sensing signal is received by the part of the scanning signal lines or the isolation part correspondingly.

14. The driving method according to claim 11, wherein a gap is provided between the isolation part and adjacent part of the light blocking layer.

15. The driving method according to claim 14, wherein a proportion of number of rows or number of columns of the isolation part to number of rows or number of columns of other part of the light blocking layer ranges from 1:3 to 1:6.

16. The driving method according to claim 14, wherein the gap has a width ranging from 1 μm to 3 μm.

* * * * *